United States Patent [19]
Kwon

[11] Patent Number: 5,561,683
[45] Date of Patent: Oct. 1, 1996

[54] CIRCULAR GRATING SURFACE EMITTING LASER DIODE

[76] Inventor: O'Dae Kwon, Professors'Apt. A-904, 756, Jigok-Dong, Pohang-Shi, Kyungsangbuk-Do, Rep. of Korea

[21] Appl. No.: 379,223

[22] Filed: Jan. 27, 1995

[30] Foreign Application Priority Data

Jan. 27, 1994 [KR] Rep. of Korea .................. 94-1404

[51] Int. Cl.$^6$ .................. H01S 3/18; H01S 3/08; H01L 33/00; G02B 5/18
[52] U.S. Cl. .................. 372/96; 372/102; 372/50; 257/98; 359/575
[58] Field of Search .................. 372/102, 96, 50, 372/43; 257/98; 359/574, 575

[56] References Cited

U.S. PATENT DOCUMENTS

| | | | |
|---|---|---|---|
| 5,164,946 | 11/1992 | Lang | 372/108 |
| 5,448,581 | 11/1995 | Wu et al. | 372/46 |

FOREIGN PATENT DOCUMENTS

| | | | |
|---|---|---|---|
| 63-187673 | 8/1988 | Japan | 257/98 |
| 4-233291 | 8/1992 | Japan | 372/96 |

OTHER PUBLICATIONS

Fallahi, M. et al., "Low Divergence Electrically Pumped Circular-Grating . . . ", Elect. Lett., vol. 29 No. 16, Aug. 5, 1993, pp. 1412–1414.

*Primary Examiner*—Rodney B. Bovernick
*Assistant Examiner*—Robert McNutt
*Attorney, Agent, or Firm*—Anderson Kill Olick & Oshinsky, P.C.

[57] ABSTRACT

A surface emitting laser diode comprises a circular grating defined on the top surface of the diode for emitting a laser therethrough, an active layer for generating the laser in the region thereof under the circular grating, a reflection layer for preventing the laser from emitting through the bottom surface of the diode and a first contact, which includes a plurality of electrodes, for providing the active layer with carriers of a first conduction type and a second contact for providing the active layer with carriers of a second conduction type.

4 Claims, 6 Drawing Sheets

CIRCULAR GRATING SURFACE EMITTING LASER DIODE

FIELD OF THE INVENTION

This invention relates to a semiconductor laser; and, in particular, to a circular grating surface emitting laser diode and an array thereof capable of providing a high power laser output.

DESCRIPTION OF THE PRIOR ART

In a conventional edge emitting laser diode, there is a waveguide formed to guide a laser parallel to the surface defined vertically by epitaxial growth and laterally by etching. The laser cavity is then formed by cleaved facets, and the laser is emitted from the edge of the diode. This type of diode structure limits the level of integration of such laser diodes onto chips since they must be placed at the edges thereof. Their arrays are limited to one dimension; and an output beam therefrom tends to be asymmetric due to the laser cavity structure.

In order to overcome these limitations, attempts have been made to extract light beams perpendicular to the wafer surface by forming a surface emitting laser. Surface emission can be achieved by defining the laser cavity vertically with layers of Bragg reflectors (vertical cavity surface emitting laser diode; VCSELD) or by incorporating a circular grating on the surface of the laser diode in order to form the so-called circular grating surface emitting laser diode(CGSELD)(see, e.g., T. Erdogan et al., "Spatial Modes of a Concentric-Circle-Grating Surface-Emitting, AlGaAs/GaAs Quantum Well Semiconductor Laser", *Applied Physics Letters*, 60, No. 15, p. 1773(April 1992)).

In the CGSELD, in particular, the optical cavity is defined by a circular grating on top of the laser diode. In the active layer below the grating, light propagates as a circular wave outward from the center of the grating and is then reflected by the circular grating to produce a radially inward-directed circular wave, and vice-versa. The light emerges through the circular grating on top of the laser diode. The grating collimates the beam so that it is circular in cross section.

Due to its unique topology, the surface emitting laser diode has numerous advantages, such as circular output beam and high two dimensionals pacing density for arrays, over the conventional edge emitting laser diode; and finds new applications in the areas of, e.g., optical computing and optical interconnections.

Since, however, electrical pumping achievable in the surface emitting laser diodes is not nearly as efficient as in the edge emitting laser diodes, the edge emitting laser diodes have been so far preferred in high power applications.

SUMMARY OF THE INVENTION

It is, therefore, an object of the invention to provide a circular grating surface emitting laser diode, which employs a plurality of disjointed electrodes and thereby enables the modulation of the direction of a laser output, and an array thereof capable of providing a high power laser output.

In accordance with the present invention, there is provided a surface emitting laser diode having a top and a bottom surfaces comprising: a circular grating defined on a portion of the top :surface for emitting a laser therethrough; an active layer for generating the laser in a region thereof under the circular grating; a reflection layer for preventing the laser from emitting through the bottom surface of the laser diode, the reflection layer being positioned intermediate the bottom surface and the active layer; a first contact for providing the active layer with carriers of a first conduction type, the first contact consisting of a plurality of electrodes., each of which is controlled independently and disposed outside the circular grating on the top surface; and a second contact for providing carriers of a second conduction type to the active layer.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
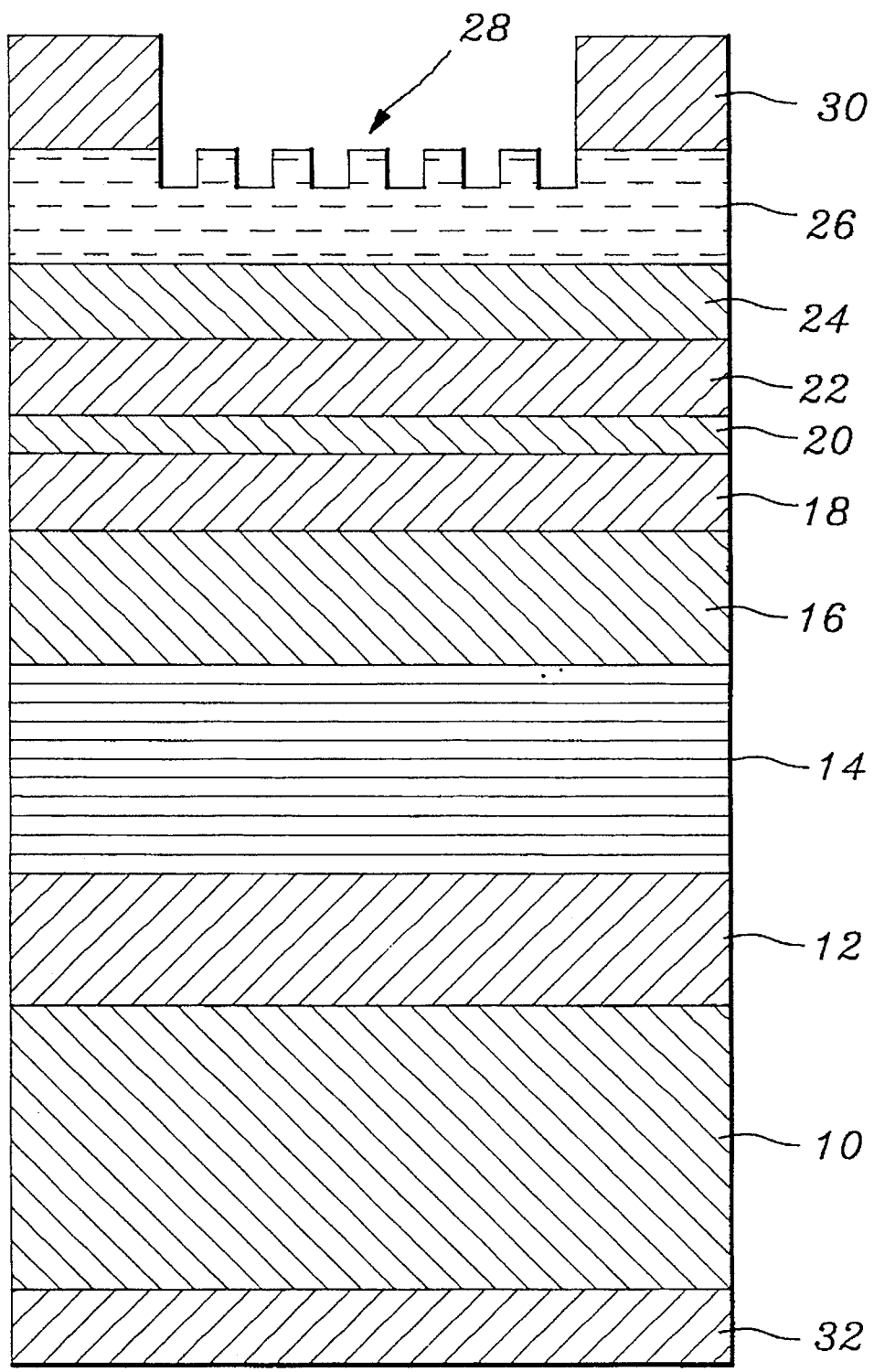
FIG. 1 shows a cross-sectional view of a circular grating surface emitting laser diode(CGSELD) in accordance with the present invention.

Referring to FIG. 1, there is illustrated a cross-sectional view of a circular grating surface emitting laser diode(CGSELD) in accordance with a preferred embodiment of the invention.

First, an $n^+$ buffer layer 12 is grown on an $n^+$ substrate 10 by employing metal organic chemical vapor deposition-(MOCVD) or molecular beam epitaxy(MBE). A GaAs substrate is employed if the laser diode is formed of a GaAs-AlGaAs material; and an InP substrate is used in lieu of the GaAs substrate in case the laser diode is made of an In GaAsP material. In a preferred embodiment of the invention, a GaAs-AlGaAs laser diode is described. The GaAs $n^+$ buffer layer is grown, as well known in the art, in order to minimize defects which may be present in subsequent layers.

An n doped reflection layer 14, which consists of a multiple number of AlAs-AlGaAs pairs, is then grown on the $n^+$ buffer layer 12. Due to periodic changes in the refractivity of the reflection layer 14, light generated from an active layer 20 is reflected to a top surface of the laser diode. An n cladding layer 16, an n grading layer 18, the active layer 20, a p grading layer 22 and a p cladding layer 24 are subsequently grown on the reflection layer 14. Layers 16 to 24, which constitute, as well known in the art, the so-called GRINSCH(graded index separate confinement heterostructure) structure(see, e.g, T. Erdogan et al. cited supra), effectively confine carriers in the active layer 20 to thereby facilitate laser generation in the active layer 20. A $p^+$ cap layer 26 is then grown on the p cladding layer 24. After the formation of the $p^+$ cap layer 26, a circular grating 28 is defined by a conventional electron beam lithography. In the next step, a p contact 30, which consists of a plurality of, e.g., 4, electrodes, and an n contact 32 are formed outside circular grating on the $p^+$ cap layer 26 and on the bottom surface of the $n^+$ substrate 10, respectively.

Figure 2:
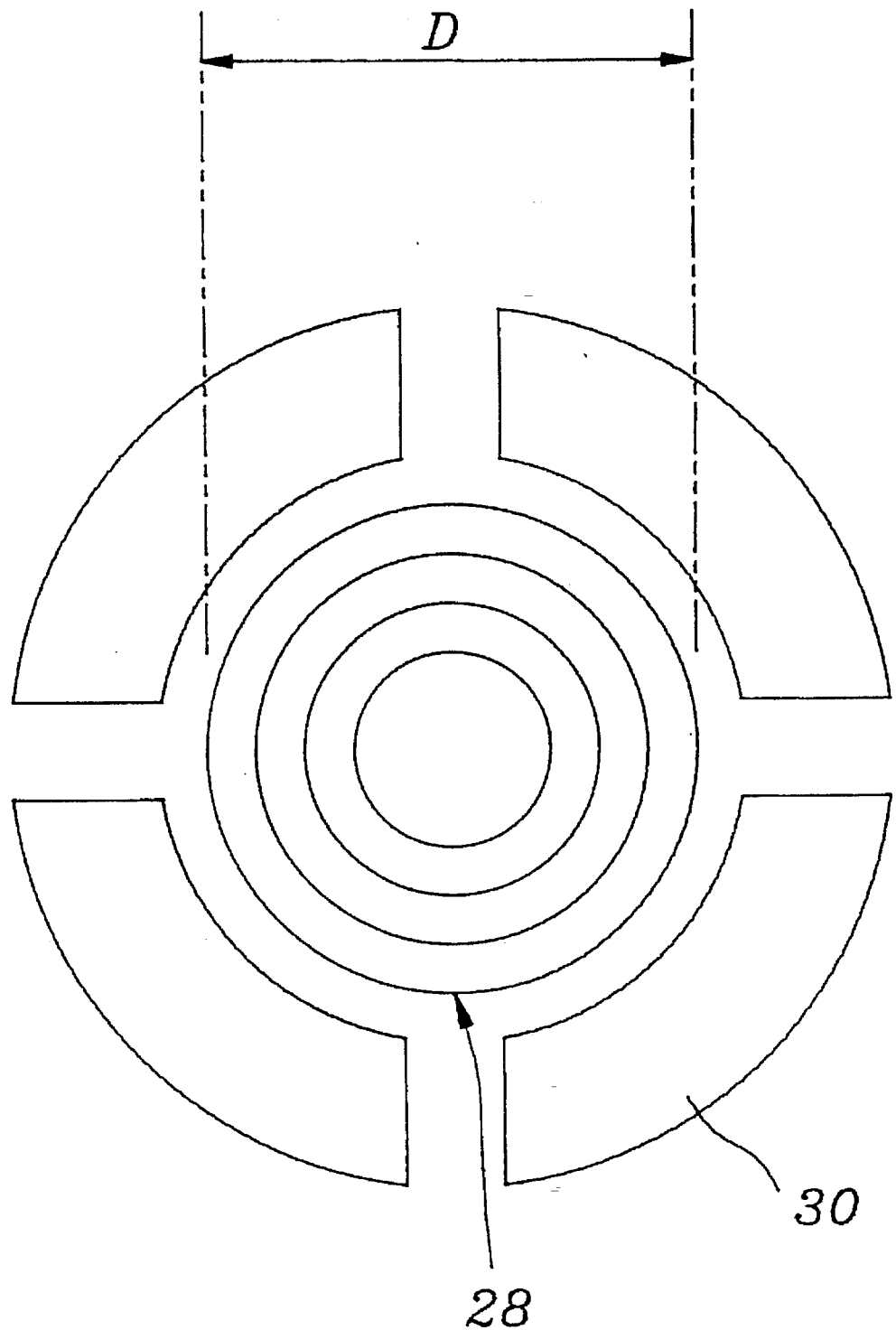
FIG. 2 presents a plan view of a CGSELD having an equally-spaced concentric circular grating and a plurality of electrodes in accordance with a preferred embodiment of the invention.

Referring to FIG. 2, there is illustrated a plan view of the equally-spaced concentric circular grating 28 and the p contact 30 shown in FIG. 1. The p contact 30 consists of a plurality of electrodes in accordance with the invention. In FIG. 2, there are shown the p contact 30 made of 4 disjointed electrodes and a portion of the circular grating 28 schematically. The circular grating 28 has, e.g., a depth and a period, both ranging from 0.1 to 0.3 µm. The radius of the circular grating 28, which can be varied depending on the desired laser spot size, may be, e.g., 200 µm.

Holes and electrons injected through the p contact 30 and the n contact 32 are effectively confined in the active layer 20 positioned within the depletion region of the GRINSCH structure and recombined therein to generate photons by the spontaneous emission thereof. In the active layer 20 below the circular grating 28, the generated photons propagate as a circular wave outward from the center of the circular grating 28. The radially expanding circular wave is then reflected by the circular grating 28 to produce a radially inward-oriented or contracting circular wave, and vice versa. With the expansion and contraction of the circular wave, the electrons and holes confined in the active layer 20 are recombined to generate laser by the stimulated emission. The generated laser is then emitted through the circular grating 28 without being scattered toward the substrate 10 due to the presence of the reflection layer 14. The laser emitting through the circular grating 28 is collimated by the grating to provide a circular laser beam having a very small divergence angle, e.g., 0.5°.

In accordance with the present invention, the direction and characteristics of the laser can be modulated through the use of a plurality of disjointed electrodes. Specifically, by applying a different volume of current to each of the electrodes, there is induced a different density of carriers under each of the electrodes, which in turn gives rise to a carrier gradient and hence a refractive index gradient in the region under the grating 28. Through the change of the refractive indices, interference between the laser beam wavelets from the grating can be varied, thereby enabling the modulation of the laser beam direction and the laser characteristics. Through the modulation of the laser beam direction and the laser characteristics, it is possible to provide a spatial optical switch and a high power laser. Furthermore, degradation of laser coherence due to the presence of a possible nonuniformity in the layers of the laser diode can be compensated through the use of a plurality of disjointed electrodes in accordance with the present invention.

Figure 3:
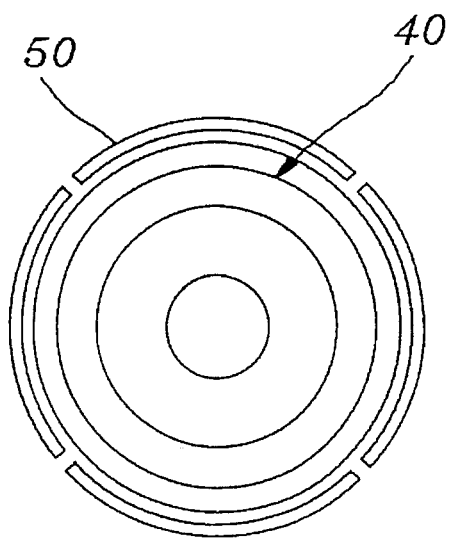
FIG. 3 represents a plan view of a CGSELD having a non-equally-spaced concentric circular grating and plurality of electrodes in accordance with a second embodiment of the invention.

Referring to FIG. 3, there is illustrated a schematic plan view of a plurality of electrodes 50 and a Fresnel Zone Plate(FZP) type non-equally-spaced concentric circular grating 40 in accordance with a second preferred embodiment of the invention. As well, known in the art, the circles in the FZP type grating are concentric or have a same center; and the focussing point of the laser can be modulated along the axis normal to the grating 40 and passing through the concentric center of the circles thereof by adjusting the spacings between circles of the grating 40. The plurality of electrodes 50 has the same function as described with reference to FIGS. 1 and 2 above.

Figure 4:
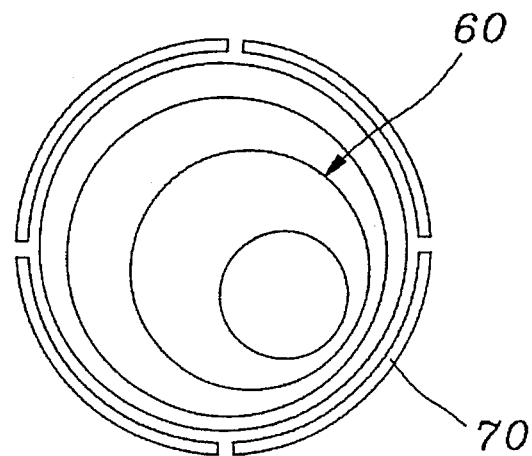
FIG. 4 provides a plan view of a CGSELD having a non-equally-spaced eccentric circular(or elliptic) grating and a plurality of electrodes in accordance with a third embodiment of the invention.

FIG. 4 shows a schematic plan view of a plurality of electrodes 70 and an Eccentric Zone Plate(EZP) type non-equally-spaced eccentric circular grating 60 in accordance with a third embodiment of the invention. The circles of the EZP type grating may be of an elliptic form and have different centers.

The spacing between the circles of the EZP type grating is not constant and it is possible to focus the laser beam on an arbitrary point by adjusting the spacings between circles and center positions of the circles. The electrodes 70 function similarly as described above with reference to FIGS. 1 and 2. Accordingly, the modulation of the focus of the laser beam can be achieved through the use of the EZP type grating and a plurality of electrodes.

Figure 5:
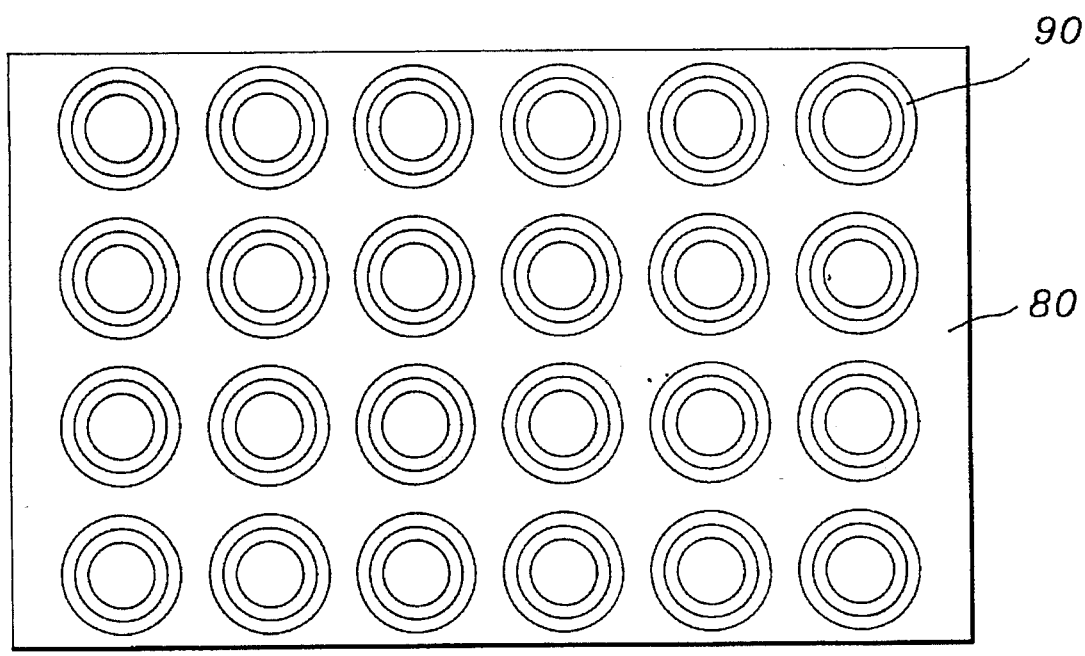
FIG. 5 illustrates a two dimensional array of equally-spaced concentric CGSELD's.

Referring to FIG. 5, there is illustrated a two dimensional laser array including a multiplicity of laser diodes 90 on a substrate 80, each of the laser diodes 90 having an equally-spaced concentric circular grating. For the sake of simplicity, the plurality of electrodes for each of the laser diodes is not depicted. The equally-spaced concentric CGSELD's 90 in an array are identical each other.

Figure 6:
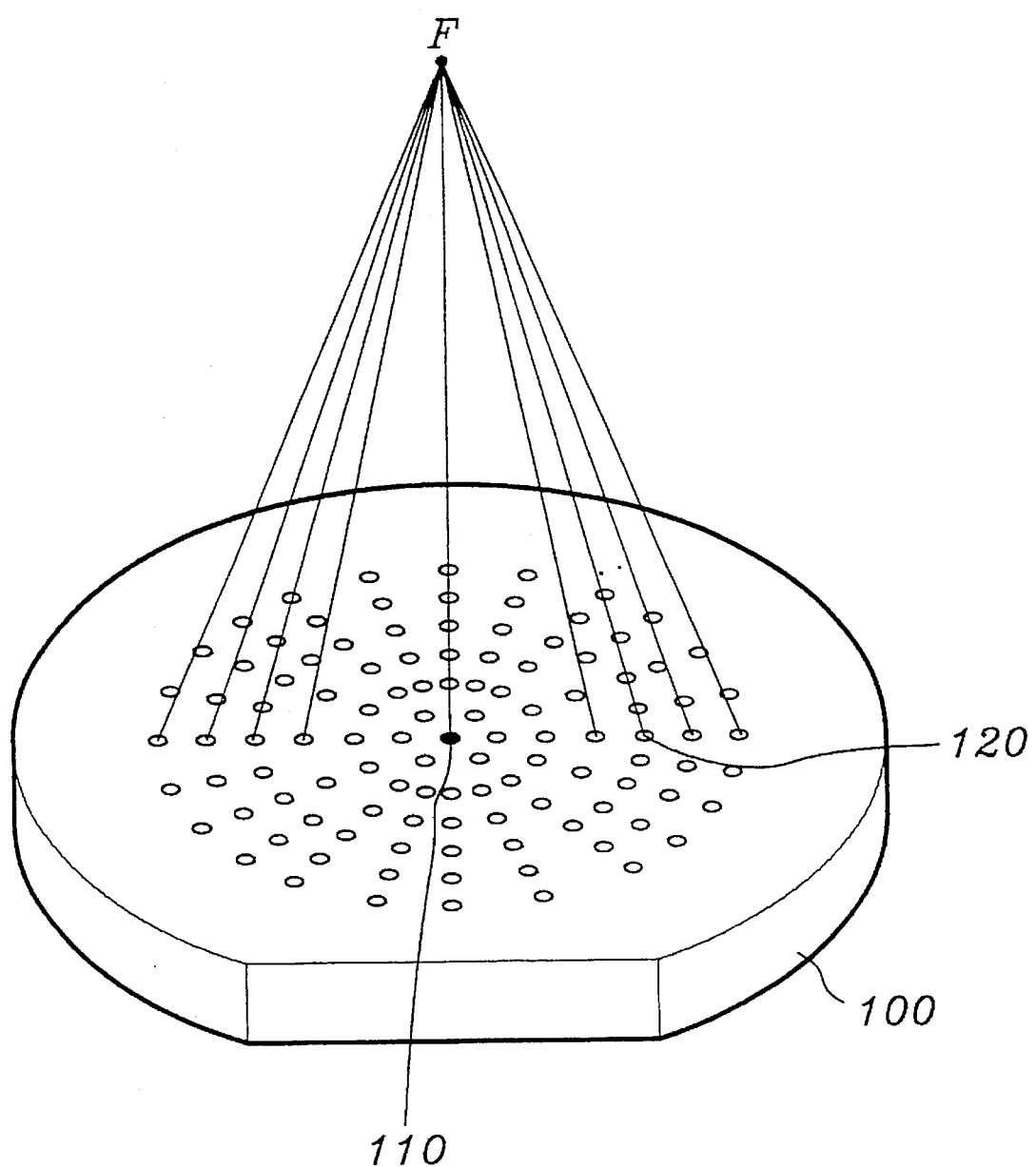
FIG. 6 offers a perspective view of an array of laser diodes formed by a non-equally-spaced concentric CGSELD and a multiplicity of non-equally-spaced eccentric CGSELD's.

In FIG. 6, there is shown a high power laser array in accordance with the present invention. As shown in the drawing, a non-equally-spaced concentric CGSELD 110 shown in FIG. 3 and a multiplicity of non-equally-spaced eccentric CGSELD's 120 shown in FIG. 4 are disposed on a substrate, e.g., a semiconductor wafer 100, such that laser beams from the CGSELD's 110 and 120 are focused on an identical point F on the axis passing through the CGSELD 110 and normal to the surface of the semiconductor wafer 100. Through the use of the laser array configuration as shown in FIG. 6, it is possible to provide a laser array for use in high power applications.

Figure 7:
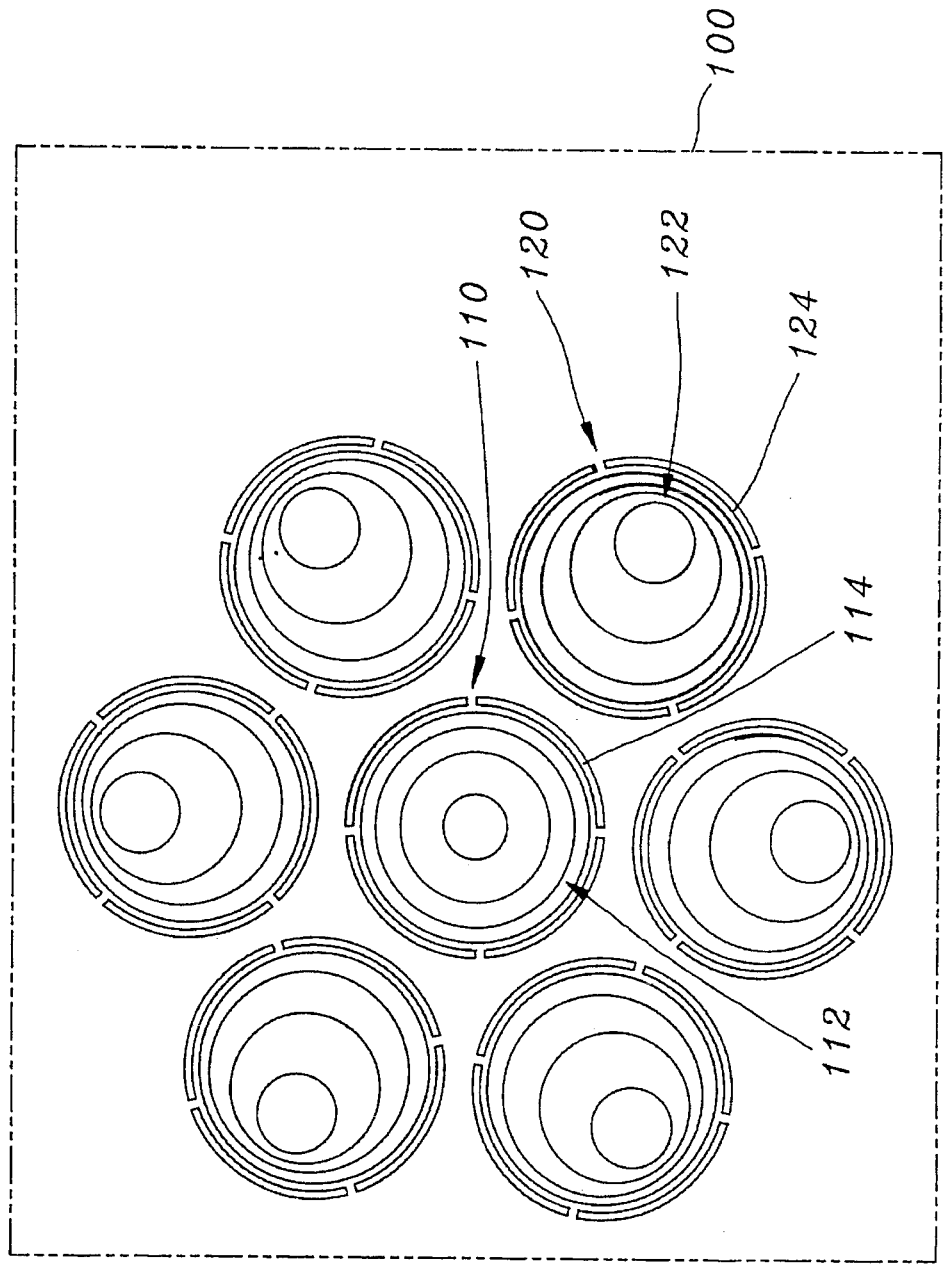
FIG. 7 depicts details of the array of laser diodes shown in FIG. 6.

Referring to FIG. 7, there is shown a detailed plan view depicting the non-equally-spaced concentric CGSELD 110 and some of the non-equally-spaced eccentric CGSELD's 120 on the substrate 100 shown in FIG. 6. The CGSELD's 110 and 120 include a plurality of, e.g,. 4, electrodes 114 and 124, respectively, which can be controlled independently. The spacing between the circles of the non-equally-spaced concentric circular grating 112 of CGSELD 110 gradually decreases outwardly. By adjusting the spacings between the circles of the grating 112 and controlling the carrier injections through the disjointed electrodes 114, the focusing point of the surface emitted laser beam from the CGSELD 110 can be modulated along the axis normal to the grating 112 and passing through the center thereof.

The focussing point of the laser beam from each of the non-equally-spaced eccentric CGSELD's 120 can be also modulated by adjusting the centers of and spacings between the circles(or ellipses) included in the non-equally-spaced eccentric circular grating 122 and by controlling the carrier injections through the electrodes 124 so that the focus of the laser beam generated from each of the CGSELD's 120 coincides with the focus of the laser beam from the CGSELD 110.

While the present invention has been described with respect to certain preferred embodiments only, other modifications and variations may be made without departing from the scope of the present invention as set forth in the following claims.

What is claimed is:

1. A surface emitting laser diode having a top and a bottom surfaces comprising:

a non-equally-spaced eccentric circular grating defined on a portion of the top surface for emitting a laser therethrough;

an active layer for generating the laser in a region thereof under the non-equally-spaced eccentric circular grating;

a reflection layer for preventing the laser from emitting through the bottom surface of the laser diode, the reflection layer being positioned intermediate the bottom surface and the active layer;

a first contact for providing the active layer with carriers of a first conduction type, the first contact having a plurality of electrodes, each of which is controlled independently and disposed outside the non-equally-spaced eccentric circular grating on the top surface; and a second contact for providing carriers of a second conduction type to the active layer.

2. An array of laser diodes including the surface emitting laser diode of claim 1.

3. A surface emitting laser diode having a top and a bottom surfaces comprising:

a non-equally-spaced eccentric elliptical grating defined on a portion of the top surface for emitting a laser therethrough;

an active layer for generating the laser in a region thereof under the non-equally-spaced eccentric elliptical grating;

a reflection layer for preventing the laser from emitting through the bottom surface of the laser diode, the reflection layer being positioned intermediate the bottom surface and the active layer;

a first contact for providing the active layer with carriers of a first conduction type, the first contact having a plurality of electrodes, each of which is controlled independently and disposed outside the non-equally-spaced eccentric elliptical grating on the top surface; and a second contact for providing carriers of a second conduction type to the active layer.

4. An array of laser diodes including the surface emitting laser diode of claim 3.

* * * * *